(12) United States Patent
Boulerne

(10) Patent No.: US 7,280,012 B2
(45) Date of Patent: Oct. 9, 2007

(54) MULTI-PROBES AS SINGLE RF TUNING ELEMENT FOR RF SLIDE-SCREW TUNERS

(75) Inventor: Philippe Boulerne, 6980 Lacroix, Montreal, Province of Quebec (CA) H4E 2V3

(73) Assignee: Philippe Boulerne, Montreal, Quebec ( * ) Notice: Subject to any disclaimer, the term of this patent is extended or adjusted under 35 U.S.C. 154(b) by 111 days.

(21) Appl. No.: 11/337,353

(22) Filed: Jan. 24, 2006

(65) Prior Publication Data

US 2007/0171008 A1 Jul. 26, 2007

(51) Int. Cl.
*H03H 7/38* (2006.01)
*G01R 27/00* (2006.01)
(52) U.S. Cl. .................... 333/263; 333/17.3; 324/642
(58) Field of Classification Search ............... 333/17.3, 333/263; 324/637, 642, 76.51, 76.49
See application file for complete search history.

(56) References Cited

U.S. PATENT DOCUMENTS

2007/0052505 A1* 3/2007 Simpson ..................... 333/263

\* cited by examiner

*Primary Examiner*—Stephen E. Jones
(74) *Attorney, Agent, or Firm*—Philippe Boulerne

(57) ABSTRACT

The present invention discloses a class of RF corrugated probes to be used in load-pull slide-screw tuner consisting of a radio-frequency (RF) or microwave slotted airline (slabline) comprising at least one RF corrugated probe controlled horizontally and vertically by remote electric control, allowing the creation of impedances which are distributed over and cover the entire Smith chart, from perfect transparency to high reflection factors. The class of RF corrugated probes disclosed in this invention includes a single RF tuning element composed of at least two RF probes fixed together with a separate probe holder.

6 Claims, 6 Drawing Sheets

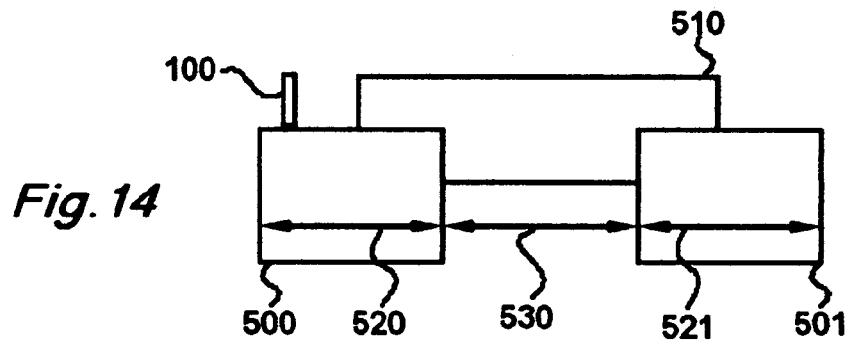
Fig. 14
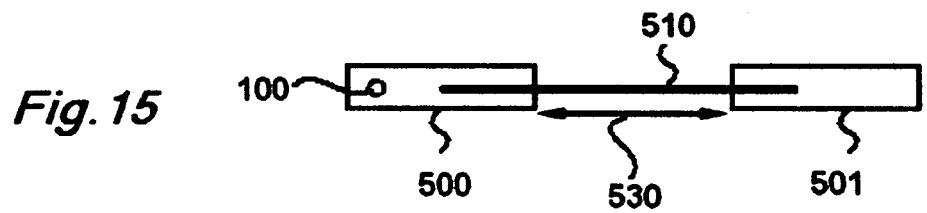
Fig. 15
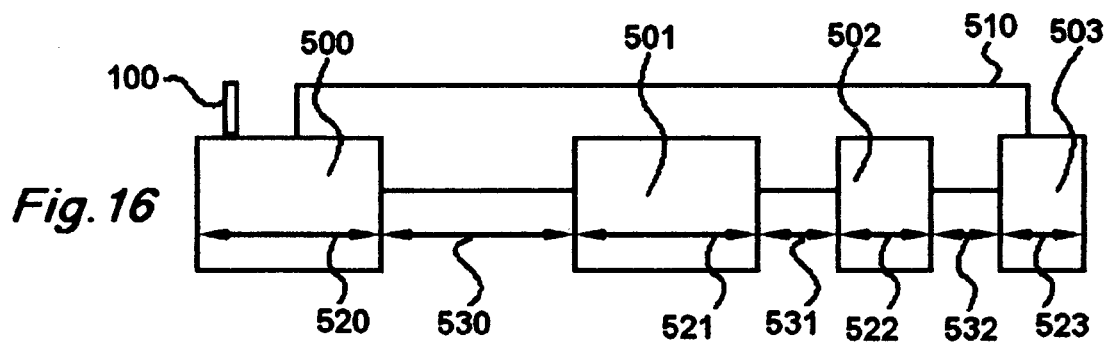
Fig. 16
Fig. 17
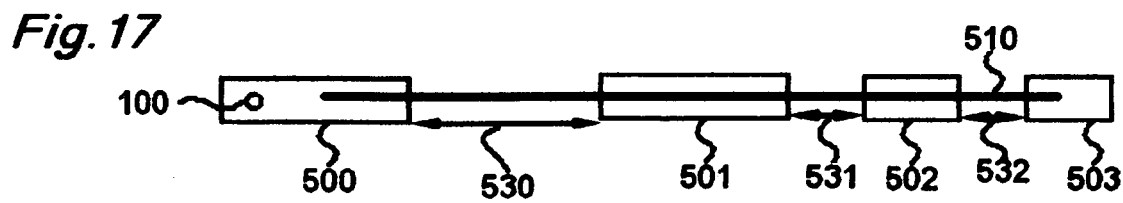

MULTI-PROBES AS SINGLE RF TUNING ELEMENT FOR RF SLIDE-SCREW TUNERS

CROSS REFERENCE TO RELATED APPLICATIONS

U.S. Patent Documents:

| 6,980,064 | Dec. 27, 2005 | Boulerne | 333/17.3 |
|---|---|---|---|

Other References:
LANGE Julius, Microwave Transistor Characterization Including S-Parameters, Texas Instruments, in Hewlett Packard Application Note 95

STATEMENT REGARDING FEDERALLY SPONSORED RESEARCH OR DEVELOPMENT

Not Applicable

REFERENCE TO A SEQUENCE LISTING, A TABLE, OR A COMPUTER PROGRAM LISTING COMPACT DISK APPENDIX

Not Applicable

BACKGROUND OF THE INVENTION

1. Field of the Invention

The present invention relates to a RF tuning element or RF probe used in electromechanical slide-screw tuners for RF impedance synthesis. The technique of subjecting DUT to variable load impedance or variable source impedance with corresponding load slide-screw tuner and source slide-screw tuner, commonly referred to as "load pull", is used to test transistors for amplifier, oscillator or frequency multiplier applications.

2. Description of Prior Art

RF probes for electromechanical tuners have been very conservative since their invention by Julius LANGE. According to FIGS. 1 & 2, a RF probe consist of a parallelepipedic bloc (1) having a curved slotted portion in relationship with the transmission line, inserted into a transmission line, including, but not limited to slabline, comprising an inner central conductor (104) and an outer grounded conductor (103). By moving this RF probe (1) with (100) up and down, i.e. toward and outward the central conductor (104) according to arrow (101), one can modify the amplitude of the VSWR (Voltage Standing Wave Ratio), while moving the RF probe (1) with (100) in parallel with the central conductor (104) according to arrow (102), one can modify the phase of the VSWR. One improvement has been disclosed in U.S. Pat. No. 6,980,064 issued to Philippe Boulerne on Dec. 27, 2005, incorporated herein by reference, which discloses a corrugated probe, which purpose is to increase the amplitude of the VSWR range. FIG. 3 discloses a corrugated probe (2) with a single corrugation, FIG. 4 discloses a corrugated probe (3) with two corrugations and FIG. 5 discloses a corrugated probe (4) with three corrugations. U.S. Pat. No. 6,980,064 does not disclose the possibility to use exiting probes and make a single RF tuning element from existing RF probes. Also U.S. Pat. No. 6,980,064 does not disclose the possibility to modify the lengths of the slots making the corrugations.

BRIEF SUMMARY OF THE INVENTION

The problem remaining in the prior art has been solved in accordance with the present invention which relates to a class of RF probes tighten together and behave like a single RF probe with a probe holder.

BRIEF DESCRIPTION OF THE SEVERAL VIEWS OF THE DRAWING

FIG. 14: depicts a two-probes RF tuning element with a top thin holder

FIG. 15: top view of FIG. 14

FIG. 16: depicts a four-probes RF tuning element with a top thin holder

FIG. 17: top view of FIG. 16

DETAILED DESCRIPTION OF THE INVENTION

Figure 1:
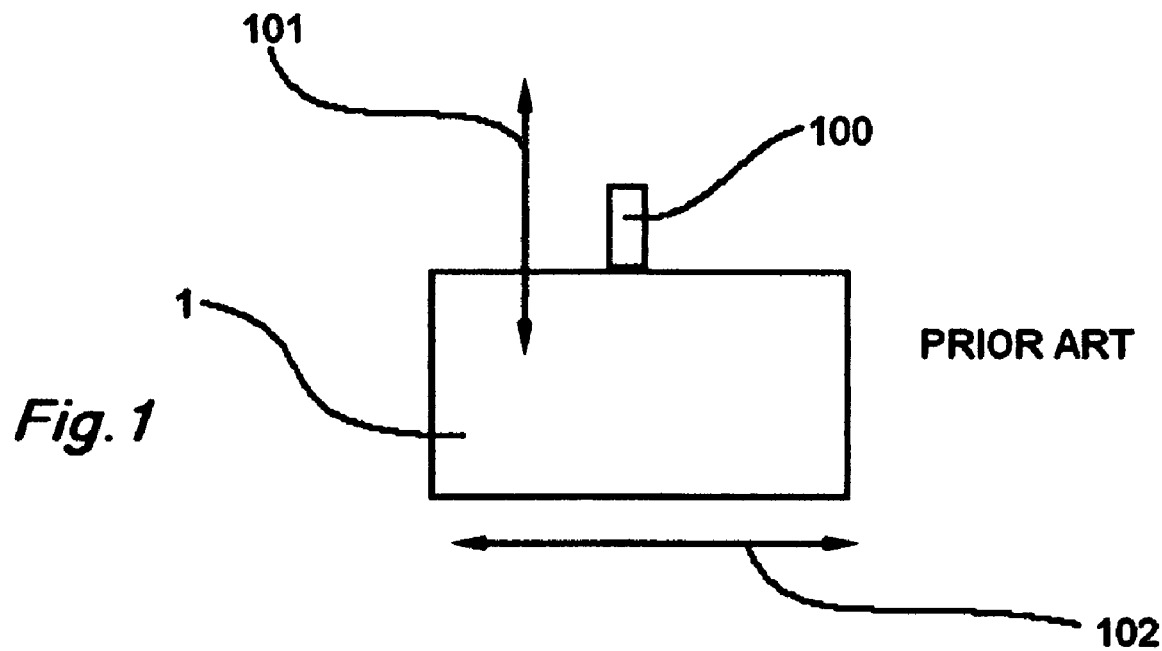
FIG. 1: PRIOR ART: depicts a single RF probe for slide-screw tuner.
Figure 2:
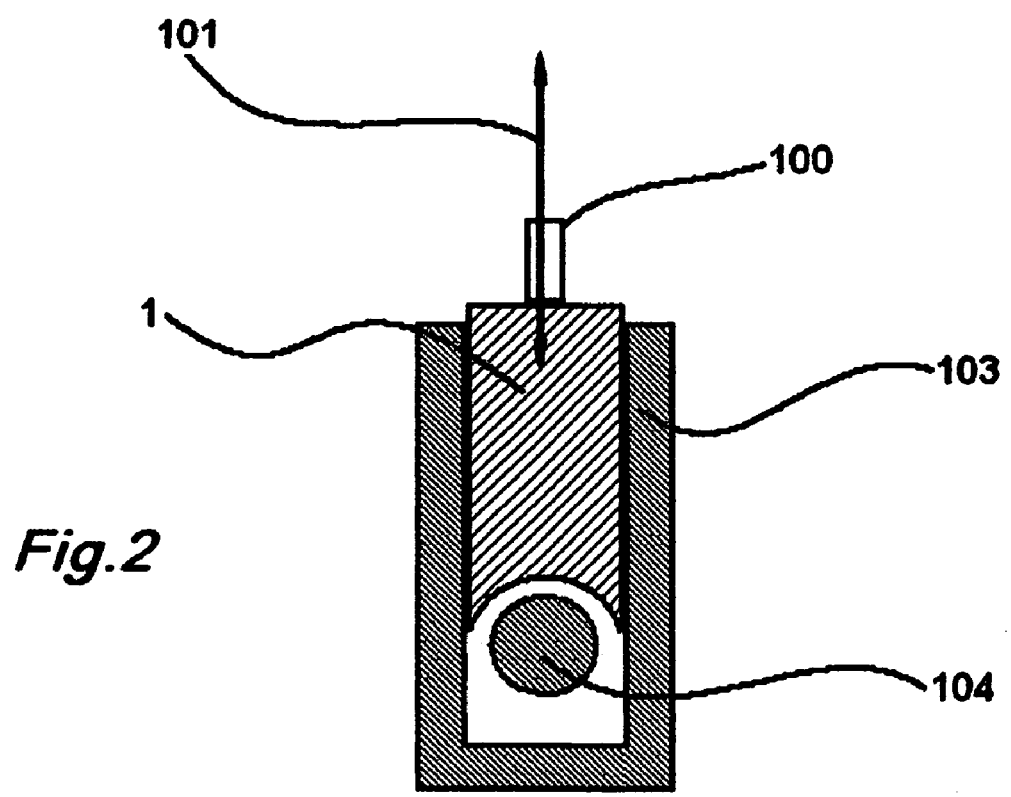
FIG. 2: depicts a transversal cross-sectional view of a parallelepipedic RF probe into a transmission line.
Figure 3:
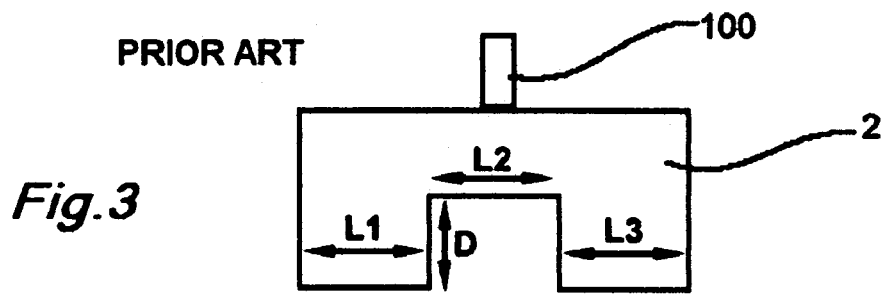
FIG. 3: PRIOR ART: depicts a RF corrugated probe with one slot.
Figure 4:
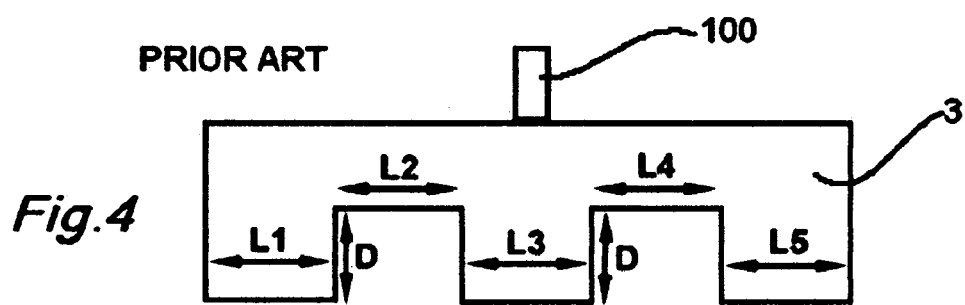
FIG. 4: PRIOR ART: depicts a RF corrugated probe with two slots.
Figure 5:
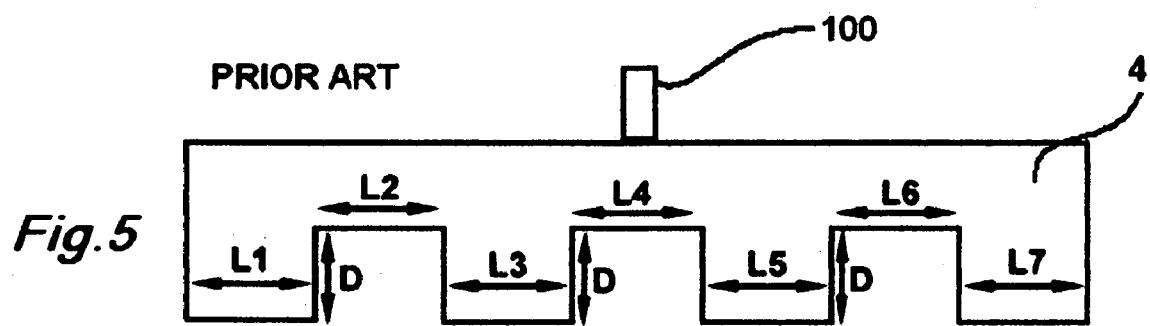
FIG. 5: PRIOR ART: depicts a RF corrugated probe with three slots.
Figure 6:
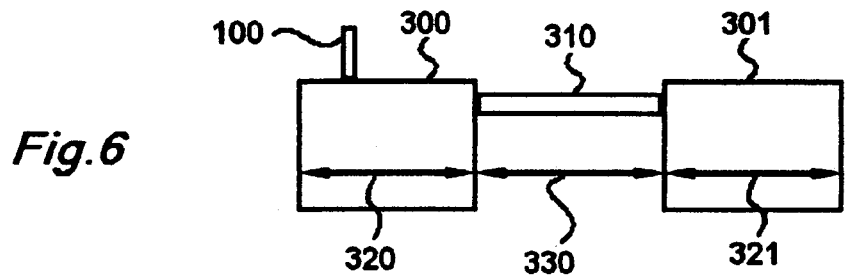
FIG. 6: depicts a two-probes RF tuning element with a transversal holder
Figure 7:
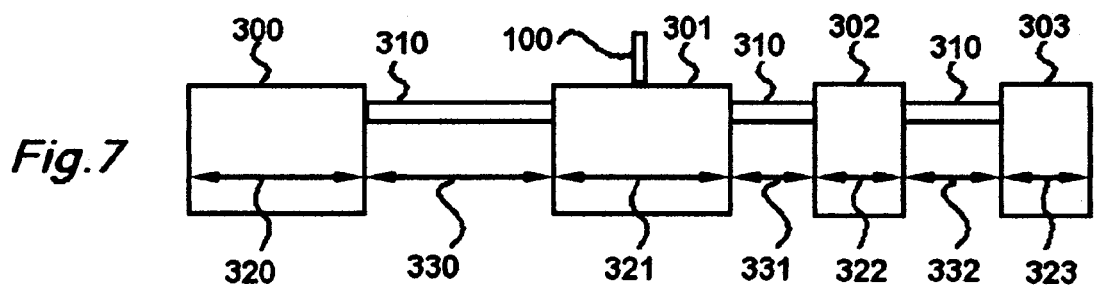
FIG. 7: depicts a four-probes RF tuning element with a transversal holder
Figure 8:
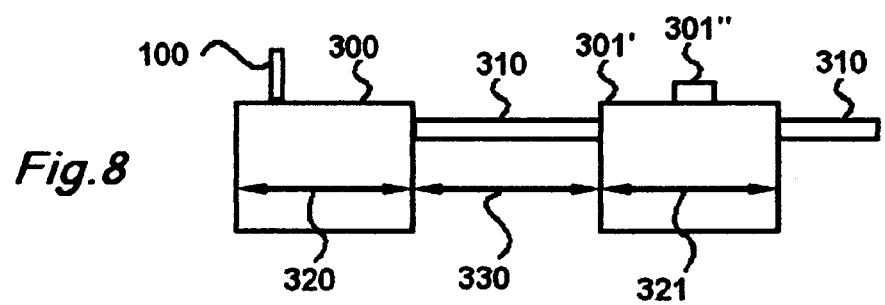
FIG. 8: depicts a two-probes RF tuning element with a transversal holder where the position of one RF probe is adjustable.
Figure 9:
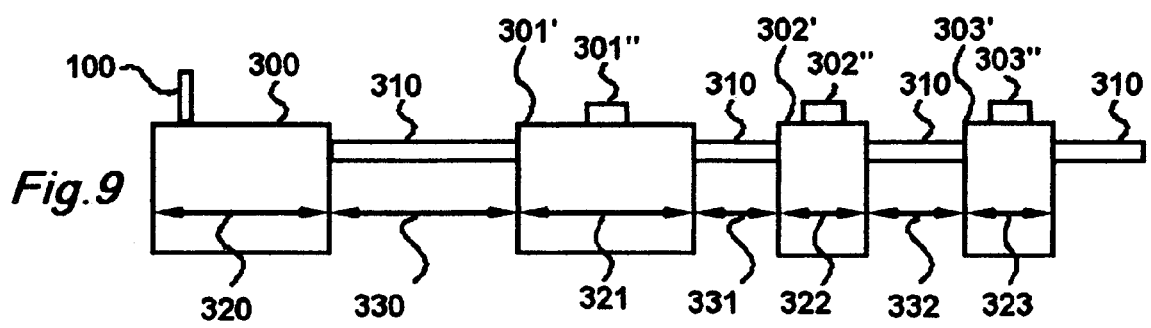
FIG. 9: depicts a four-probes RF tuning element with a transversal holder where the position of three RF probes are adjustable.

In a first preferred embodiment, the present invention discloses a multi-probes tuning element composed of two RF probes (300, 301) as described by FIG. 6 or composed of four RF probes (300, 301, 302, 303) as described by FIG. 7, where the RF probes are tighten together using a transversal holder (310) that goes through the RF probes and maintain them together. The RF probes (300, 301, 302, 303) can have different longitudinal lengths (320, 321, 322, 323) and different inter-spacings (330, 331, 332) so the electromagnetic behaviour of the tuning element can be optimized regarding different specifications. The RF probes (300, 301, 302, 303) can be fixed compare to the transversal holder (310). In another preferred embodiment, the present invention discloses RF probes that are moveable compared to the transversal holder (310) as described by FIG. 8 with RF probe (301') moveable compared to RF probe (300), or described by FIG. 9 with RF probes (301', 302', 303') moveable along the transversal holder and therefore the longitudinal spacings (330, 331, 332) between the RF probes are adjustable by design. The RF probes (301', 302', 303') can be secured with the help of any attaching mechanism (301", 302", 303") such as, but not limited to, screws, in order to maintain fixed the inter-spacings (330, 331, 332) once adjusted. In the particular case of two RF probes as depicted by FIG. 8, the transversal holder can be a screw, making RF probe (301') moveable compared to RF probe (300), and the inter-spacing (330) adjustable. The main advantage of this technique of having a transversal holder going through RF probes is the possibility to make a corrugated probe from existing RF probes.

Figure 10:
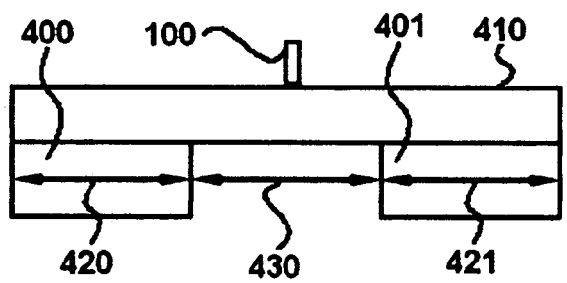
FIG. 10: depicts a two-probes RF tuning element with a top holder
Figure 11:
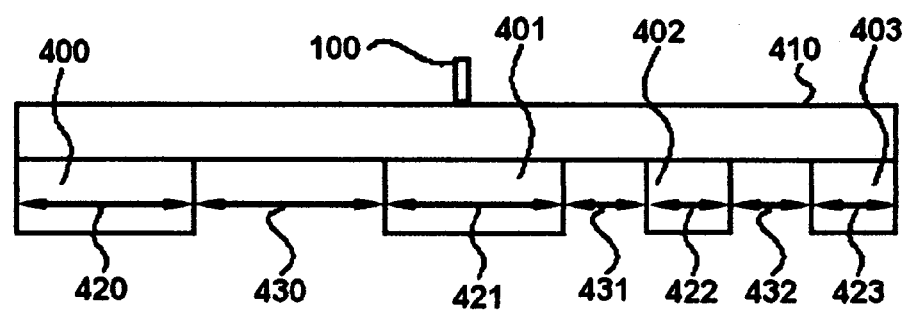
FIG. 11: depicts a four-probes RF tuning element with a top holder
Figure 12:
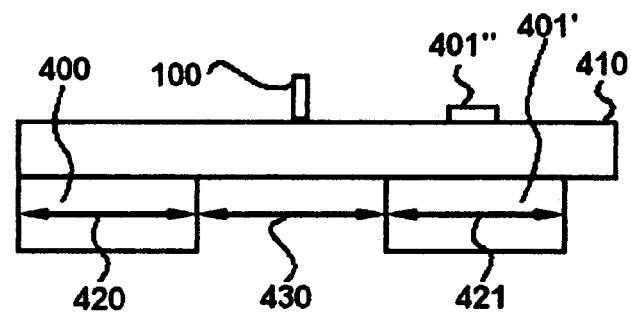
FIG. 12: depicts a two-probes RF tuning element with a top holder where the position of one RF probe is adjustable.
Figure 13:
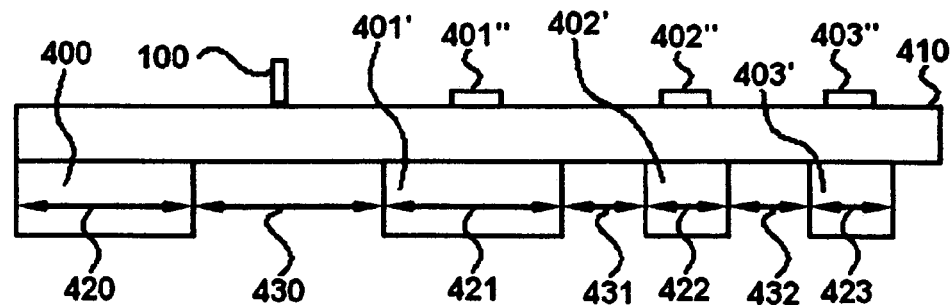
FIG. 13: depicts a four-probes RF tuning element with a top holder where the position of three RF probes are adjustable.

In a second preferred embodiment, the present invention discloses a multi-probes tuning element composed of two RF probes (400, 401) as described by FIG. 10 or composed of four RF probes (400, 401, 402, 403) as described by FIG. 11, where the RF probes are tighten together using a top holder (410) that is above the RF probes and maintain said probes together. The RF probes (400, 401, 402, 403) can have different longitudinal lengths (420, 421, 422, 423) and different inter-spacings (430, 431, 432) so the electromagnetic behaviour of the tuning element can be optimized regarding different specifications. The RF probes (400, 401, 402, 403) can be fixed compare to the top holder (410). In another preferred embodiment, the present invention discloses RF probes that are moveable compared to the top holder (410) as described by FIG. 12 with RF probe (401') moveable compared to RF probe (400), or as described by FIG. 13 with RF probes (401', 402', 403') moveable along the top holder and therefore the longitudinal spacings (430, 431, 432) between the RF probes are adjustable by design. The RF probes (401', 402', 403') can be secured with the help of any attaching mechanism (401", 402", 403") such as, but not limited to, screws, in order to maintain fixed the inter-spacings (430, 431, 432) once adjusted. The main advantage of this technique is the possibility to use smaller in height probes and have a strong probe holder (410) to get good rigidity.

Figure 18:
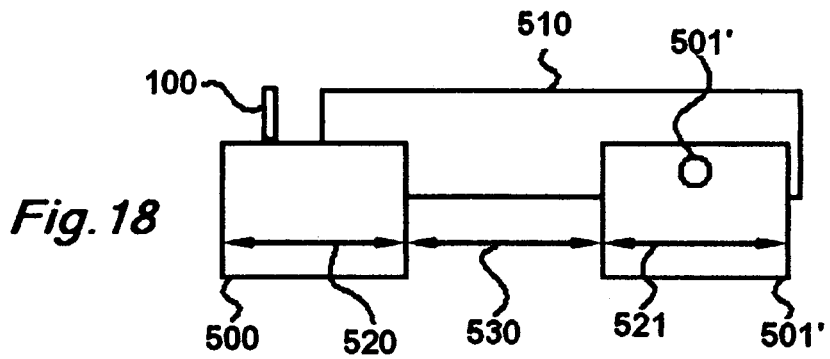
FIG. 18: depicts a two-probes RF tuning element with a top thin holder where the position of one RF probe is adjustable.
Figure 19:
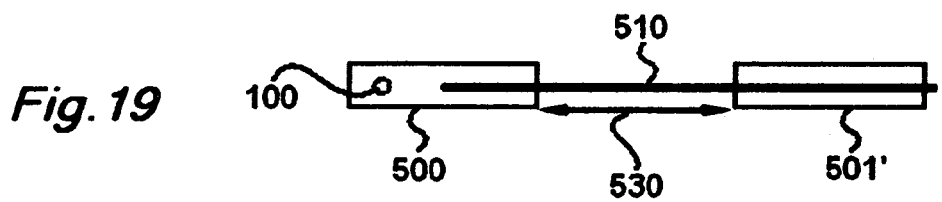
FIG. 19: top view of FIG. 18
Figure 20:
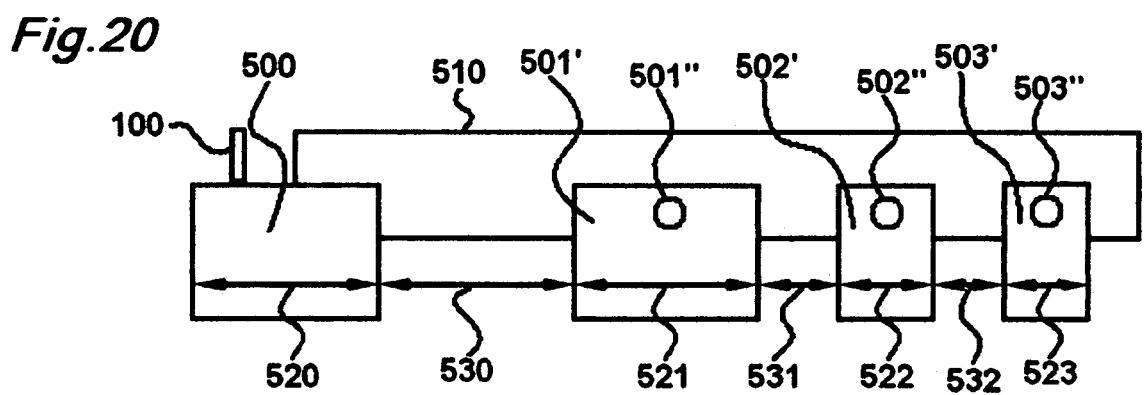
FIG. 20: depicts a four-probes RF tuning element with a top thin holder where the position of three RF probes are adjustable.
Figure 21:
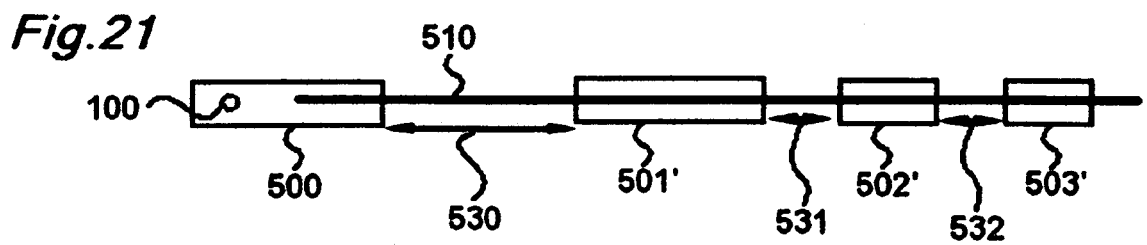
FIG. 21: top view of FIG. 20

In a third preferred embodiment, the present invention discloses a multi-probes tuning element composed of two RF probes (500, 501) as described by FIG. 14 or composed of four RF probes (500, 501, 502, 503) as described by FIG. 16, where the RF probes are tighten together using a thin top holder (510) that is above the RF probes and maintain them together. The thin top holder is going into a slot located on the top of the RF probes, as described by FIGS. 19 and 21. The RF probes (500, 501, 502, 503) can have different longitudinal lengths (520, 521, 522, 523) and different inter-spacings (530, 531, 532) so the electromagnetic behaviour of the tuning element can be optimized regarding different specifications. The RF probes (500, 501, 502, 503) can be fixed compare to the top holder (510). In another preferred embodiment, the present invention discloses RF probes that are moveable compared to the top holder (510) as described by FIG. 18 with RF probe (501') moveable compared to RF probe (500), or described by FIG. 20 with RF probes (501', 502', 503') moveable along the thin top holder and therefore the longitudinal spacings (530, 531, 532) between the RF probes are adjustable by design. The RF probes (501', 502', 503') can be secured with the help of any attaching mechanism (501", 502", 503") such as, but not limited to, screws, in order to maintain fixed the inter-spacings (530, 531, 532) once adjusted. The main advantage of this technique is that the holding device can be very thin, therefore minimizing the interferences of the holding device with the central conductor (104) where the interferences are not desirable, i.e. during the inter-spaces (530, 531, 532).

Although the present invention has been explained hereinabove by way of a preferred embodiment thereof, it should be pointed out that any modifications to this preferred embodiment within the scope of the appended claims is not deemed to alter of change the nature and scope of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A tuning element comprising at least two RF probes having a curved slotted portion in relationship with a transmission line and tighten together with a fixing device screw going through said probes that hold said probes together with longitudinal inter-spacings between said RF probes.

2. A tuning element as in claim 1, where the fixing device is a bar.

3. A tuning element as in claim 2, where at least one probe is moveable along the transversal bar and fixable compared to said transversal bar with screws.

4. A tuning element as in claim 1, limited to two RE probes, where the fixing device is a screw, said screw is making the inter-spacing between said two RE probes adjustable.

5. A tuning element comprising a top holder where a least two RF probes can be fixed at the bottom of said top holder, said RF probes having a curved slotted portion in relationship with a transmission line where at least one RF probe is moveable along said top holder and fixable compared to said top holder with screws.

6. A tuning element comprising a least RF two probes that are tightened together with a thin holder inserted in a slot on the top of said RF probes, said RF probes having a curved slotted portion in relationship with a transmission line where at least one RF probe is moveable along said thin top holder and fixable compared to said top holder with screws.

* * * * *